(12) United States Patent
Won

(10) Patent No.: US 10,522,198 B2
(45) Date of Patent: Dec. 31, 2019

(54) SEMICONDUCTOR MEMORY DEVICE

(71) Applicant: SK hynix Inc., Gyeonggi-do (KR)

(72) Inventor: Hyung Sik Won, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/015,808

(22) Filed: Jun. 22, 2018

(65) Prior Publication Data

US 2019/0156868 A1 May 23, 2019

(30) Foreign Application Priority Data

Nov. 23, 2017 (KR) ........................ 10-2017-0157112

(51) Int. Cl.
*G11C 5/14* (2006.01)
*G11C 7/08* (2006.01)
*G11C 7/12* (2006.01)
*H03F 1/02* (2006.01)
*H03F 3/45* (2006.01)
*H03F 1/30* (2006.01)
*G11C 7/06* (2006.01)

(52) U.S. Cl.
CPC ............... *G11C 7/08* (2013.01); *G11C 5/146* (2013.01); *G11C 5/147* (2013.01); *G11C 7/062* (2013.01); *G11C 7/12* (2013.01); *H03F 1/0211* (2013.01); *H03F 1/30* (2013.01); *H03F 3/45076* (2013.01)

(58) Field of Classification Search
CPC ................................. G11C 5/146; G11C 5/147
USPC .................................................... 365/189.09
See application file for complete search history.

(56) References Cited

U.S. PATENT DOCUMENTS

| | | | | |
|---|---|---|---|---|
| 5,905,685 A * | 5/1999 | Nakamura | .......... | G11C 11/4074 365/205 |
| 6,052,324 A * | 4/2000 | Tobita | ...................... | G11C 7/06 365/149 |
| 6,407,956 B2 * | 6/2002 | Ooishi | ..................... | G11C 7/06 365/205 |
| 7,362,636 B2 * | 4/2008 | Tsukada | ................. | G11C 5/146 365/205 |
| 7,505,343 B2 * | 3/2009 | Kang | ..................... | G11C 7/065 365/205 |
| 7,535,282 B2 * | 5/2009 | Kim | ........................ | G05F 3/205 327/376 |
| 7,548,476 B2 * | 6/2009 | Savignac | ............... | G11C 7/065 365/189.09 |
| 7,755,963 B2 * | 7/2010 | Kang | .................. | G11C 11/4091 365/203 |

(Continued)

FOREIGN PATENT DOCUMENTS

KR 1020130053603 5/2013

*Primary Examiner* — Son L Mai
(74) *Attorney, Agent, or Firm* — IP & T Group LLP

(57) ABSTRACT

A semiconductor memory device includes a sense amplifier, a voltage supply circuit and a voltage supply control circuit. The sense amplifier may be activated by receiving driving voltages from first to third voltage supply lines to detect and amplify voltage levels of a data line and a data bar line. The voltage supply circuit may apply the driving voltages to the first to third voltage supply lines in response to first to third voltage supply signals and a bias control signal. The voltage supply control circuit may generate the first to third voltage supply signals and the bias control signal in response to an active signal.

17 Claims, 5 Drawing Sheets

(56) References Cited

U.S. PATENT DOCUMENTS

| | | | |
|---|---|---|---|
| 8,509,018 B2* | 8/2013 | Katoch | G11C 11/4091 365/189.09 |
| 2013/0121099 A1* | 5/2013 | Won | G11C 7/065 365/207 |

* cited by examiner

SEMICONDUCTOR MEMORY DEVICE

CROSS-REFERENCES TO RELATED APPLICATION

The present application claims priority under 35 U.S.C. § 119(a) to Korean application number 10-2017-0157112, filed on Nov. 23, 2017, which is incorporated herein by reference in its entirety.

BACKGROUND

1. Technical Field

Various embodiments may generally relate to a semiconductor integrated circuit and, more particularly, to a semiconductor memory device.

2. Related Art

Generally, a semiconductor memory device may store and output data.

Providing a reliable semiconductor memory device that combines low power consumption and rapid operational speed would be highly desirable. Such semiconductor memory device may be capable of detecting and amplifying the stored data at a high speed using low power.

SUMMARY

Example embodiments of the invention provide a semiconductor memory device capable of ensuring reliability for detecting and amplifying data with a rapid operational speed.

In example embodiments of the present disclosure, a semiconductor memory device may include a sense amplifier, a voltage supply circuit and a voltage supply control circuit. The sense amplifier may be activated by receiving driving voltages from first to third voltage supply lines to detect and amplify voltage levels of a data line and a data bar line. The voltage supply circuit may apply the driving voltages to the first to third voltage supply lines in response to first to third voltage supply signals and a bias control signal. The voltage supply control circuit may generate the first to third voltage supply signals and the bias control signal in response to an active signal.

In example embodiments of the present disclosure, a semiconductor memory device may include a sense amplifier, a voltage supply control circuit and a power supply circuit. The sense amplifier may include a plurality of transistors. The voltage supply control circuit may generate a bias control signal in response to an active signal. The voltage supply circuit may provide any one of the transistors with any one of a first negative voltage and a second negative voltage as a back bias voltage in response to the bias control signal.

In example embodiments of the present disclosure, a semiconductor memory device may change a back bias voltage of any one of transistors in a sense amplifier when voltage levels of a data line and a data bar line may be changed.

According to example embodiments, the semiconductor memory device may have data reliability and a rapid operational speed.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept. Although a few embodiments of the present invention will be shown and described, it will be appreciated by those of ordinary skill in the art that changes may be made in these embodiments without departing from the principles and spirit of the present invention.

In describing the present disclosure, when it is determined that the detailed description of the known related art may obscure the gist of the present disclosure, the detailed description thereof will be omitted.

Although the terms such as first and second may be used to describe various components, the components are not limited by the terms, and the terms are used only to distinguish components from other components.

As used herein, singular forms are intended to include the plural forms as well, unless the context clearly indicates otherwise.

It will be further understood that the terms "includes", and "including" are used interchangeably with the open ended terms "comprises", "comprising", to specify the presence of any stated elements and to not preclude the presence or addition of one or more other elements.

Also, as used herein, the term "and/or" includes any and all combinations of one or more of the associated listed items.

In the following description, numerous specific details are set forth in order to provide a thorough understanding of the present invention. However, the present invention may be practiced without some or all these specific details.

In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Figure 1:
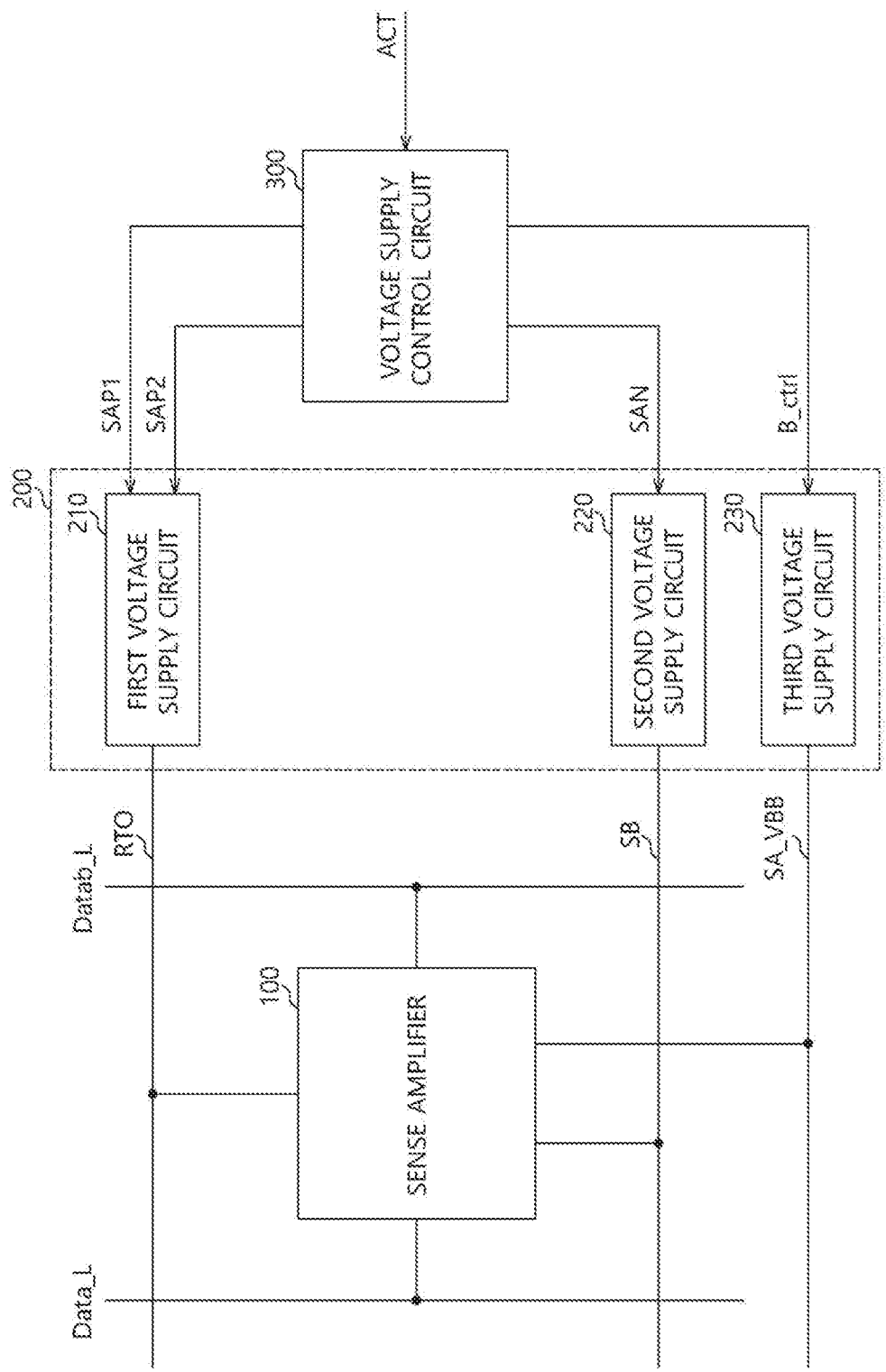
FIG. 1 is a view illustrating a semiconductor memory device in accordance with example embodiments.

FIG. 1 is a view illustrating a semiconductor memory device in accordance with example embodiments.

Referring to FIG. 1, a semiconductor memory device of this example embodiment may include a sense amplifier 100, a voltage supply circuit 200 and a voltage supply control circuit 300.

The sense amplifier 100 may receive driving voltages from a first voltage supply line RTO, a second voltage supply line SB and a third voltage supply line SA_VBB to detect and amplify a voltage difference between a data line Data_L and a data-bar line Datab_L. For example, the sense amplifier 100 may be activated by receiving the driving voltages from the first to third voltage supply lines RTO, SB and SA_VBB. The activated sense amplifier 100 may detect and amplify the voltage difference between the data line Data_L and the data-bar line Datab_L. The data line Data_L and the data-bar line Datab_L may be a bit line connected with a memory cell.

The voltage supply circuit 200 may provide the first voltage supply line RTO with the driving voltage in response to a first voltage supply signal SAP1 and a second voltage supply signal SAP2. The voltage supply circuit 200 may provide the second voltage supply line SB with the driving voltage in response to a third voltage supply signal SAN. The voltage supply circuit 200 may provide the third voltage supply line SA_VBB with the driving voltage in response to a bias control signal B_ctrl.

The voltage supply circuit 200 may include a first voltage supply circuit 210, a second voltage supply circuit 220 and a third voltage supply circuit 230.

The first voltage supply circuit 210 may selectively provide the first voltage supply line RTO with a high voltage VPP (See FIG. 3) and an external voltage VDD (See FIG. 3) as the driving voltage in response to the first voltage supply signal SAP1 and the second voltage supply signal SAP2.

The second voltage supply circuit 220 may provide the second voltage supply line SB with a ground voltage VSS (See FIG. 3) as the driving voltage in response to the third voltage supply signal SAN.

The third voltage supply circuit 230 may provide the third voltage supply line SA_VBB with a first negative voltage VBB1 (See FIG. 3) and a second negative voltage VBB2 (See FIG. 3) as the driving voltage in response to the bias control signal B_ctrl. The second negative voltage VBB2 may have a level higher than that of the first negative voltage VBB1.

The voltage supply control circuit 300 may generate the first to third voltage supply signals SAP1, SAP2 and SAN and the bias control signal B_ctrl in response to an active signal ACT.

For example, when the active signal ACT is enabled, the voltage supply control circuit 300 may enable the first voltage supply signal SAP1 for a set time. When the first voltage supply signal SAP1 is disabled, the voltage supply control circuit 300 may enable the second voltage supply signal SAP2. The voltage supply control circuit 300 may generate the third voltage supply signal SAN having an enable section substantially the same as those of the first and second voltage supply signals SAP1 and SAP2. The voltage supply control circuit 300 may generate the bias control signal B_ctrl enabled for a set time when the active signal ACT is enabled and disabled.

Figure 2:
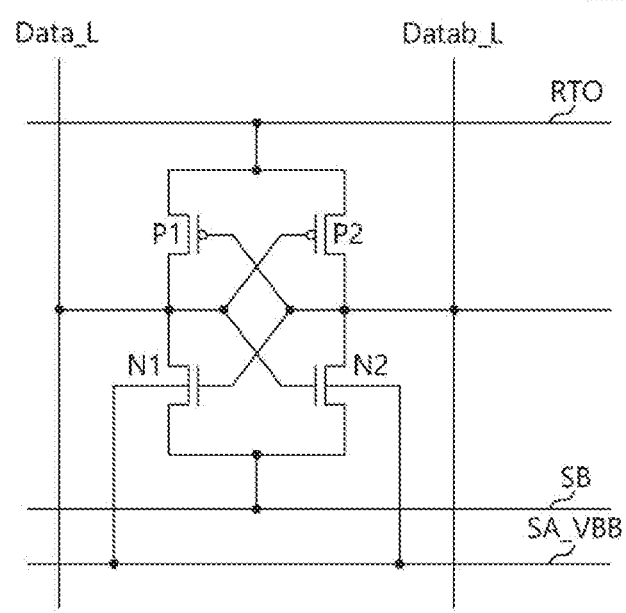
FIG. 2 is a view illustrating an example embodiment of a sense amplifier employed in the semiconductor memory device shown in FIG. 1.

FIG. 2 is a view illustrating a sense amplifier 100 of FIG. 1.

Referring to FIG. 2, the sense amplifier 100 may include a first transistor P1, a second transistor P2, a third transistor N1 and a fourth transistor N2. The first transistor P1 may include a gate connected to the data-bar line Datab_L, and a source connected to the first voltage supply line RTO. The second transistor P2 may include a gate commonly connected to the data line Data_L and a drain of the first transistor P1, and a source connected to the first voltage supply line RTO. The third transistor N1 may include a gate commonly connected to the data-bar line Datab_L and a drain of the second transistor P2, a drain connected to the drain of the first transistor P1, a source connected to the second voltage supply line SB, and a back bias voltage terminal connected to the third voltage supply line SA_VBB. The fourth transistor N2 may include a gate commonly connected to the data line Data_L and the drain of the first transistor P1, a drain connected to the drain of the second transistor P2, a source connected to the second voltage supply line SB, and a back bias voltage terminal connected to the third voltage supply line SA_VBB. Further, the first transistor P1 and the second transistor P2 may be a P channel transistor and the third transistor N1 and the fourth transistor N2 may be a N channel transistor.

When a voltage difference between a gate and a source in the respective transistors P1, P2, N2 and N2 generated by a voltage difference between the data line Data_L and the data-bar line Datab_L is higher than a threshold voltage of each of the transistors P1, P2, N1 and N2, the transistors P1, P2, N1 and N2 may be selectively turned-on to amplify the voltage levels of the data line Data_L and the data-bar line Datab_L to a voltage level of the first and second voltage supply lines RTO and SB. Here, because the third and fourth transistors N1 and N2 may receive the voltage from the third voltage supply line SA_VBB as the back bias voltage, the threshold voltages of the third and fourth transistors N1 and N2 may be changed when the voltage level of the third voltage supply line SA_VBB is changed.

For example, when the voltage level of the third voltage supply line SA_VBB is increased, the threshold voltages of the third and fourth transistors N1 and N2 may be decreased. Thus, the threshold voltages of the third and fourth transistors N1 and N2 may vary in accordance with changes of the voltage level of the third voltage supply line SA_VBB. When the voltage level of the third voltage supply line SA_VBB is increased by about 20%, the threshold voltages of the third and fourth transistors N1 and N2 may be decreased by about 20%. Although the third and fourth transistors N1 and N2 have substantially the same threshold voltage, a difference between the threshold voltages of the third and fourth transistors N1 and N2 may be generated due to a variation of a process, a voltage and/or a temperature (P.V.T). When the threshold voltages of the third and fourth transistors N1 and N2 are decreased by about 20% due to the level change of the back bias voltage, i.e., the voltage level change of the third voltage supply line SA_VBB, the level difference between the threshold voltages of the third and fourth transistors N1 and N2 may also be decreased by about 20%. Therefore, when the level difference between the threshold voltages of the transistors in the sense amplifier 100, that is, a mismatch between the transistors is generated, the voltage level of the third voltage supply line SA_VBB for providing the back bias voltage may be changed to compensate the mismatch.

Figure 3:
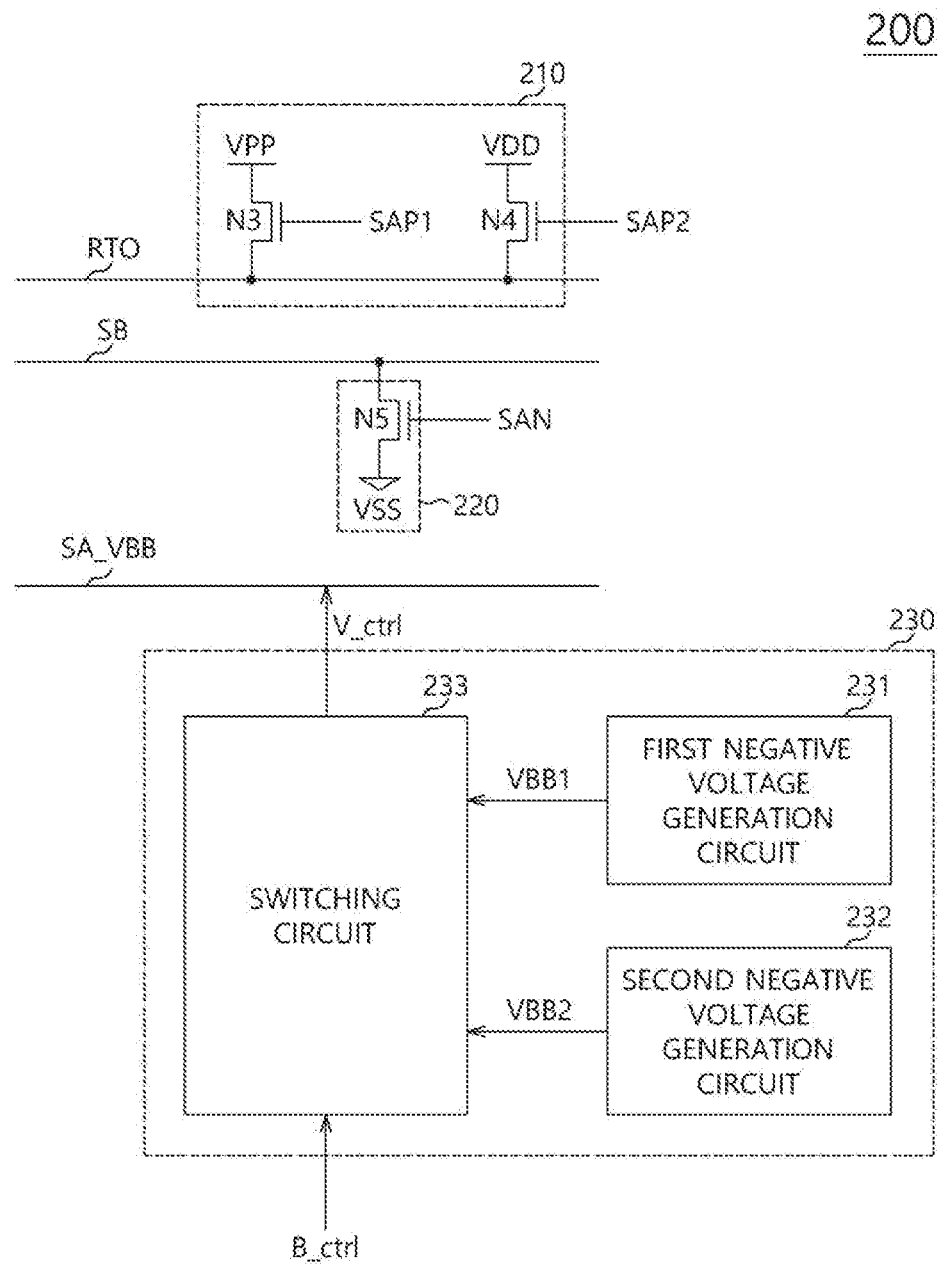
FIG. 3 is a view illustrating an example embodiment of a voltage supply circuit employed in the semiconductor memory device shown in FIG. 1.

FIG. 3 is a view illustrating an exemplary voltage supply circuit 200 of FIG. 1.

Referring to FIG. 3, the voltage supply circuit 200 may include the first voltage supply circuit 210, the second voltage supply circuit 220 and the third voltage supply circuit 230.

The first voltage supply circuit 210 may include a fifth transistor N3 and a sixth transistor N4. The fifth transistor N3 may provide the first voltage supply line RTO with the high voltage VPP in response to the first voltage supply signal SAP1. For example, when the first voltage supply signal SAP1 is enabled, the fifth transistor N3 may provide the first voltage supply line RTO with the high voltage VPP. The fifth transistor N3 may include a gate for receiving the first voltage supply signal SAP1, a drain for receiving the high voltage VPP, and a source connected to the first voltage supply line RTO. The sixth transistor N4 may provide the first voltage supply line RTO with the external voltage VDD in response to the second voltage supply signal SAP2. For example, when the second voltage supply signal SAP2 is enabled, the sixth transistor N4 may provide the first voltage supply line RTO with the external voltage VDD. The sixth transistor N4 may include a gate for receiving the second voltage supply signal SAP2, a drain for receiving the external voltage VDD, and a source connected to the first voltage supply line RIO.

The second voltage supply circuit 220 may include a seventh transistor N5. The seventh transistor N5 may provide the second voltage supply line SB with a ground voltage VSS in response to the third voltage supply signal SAN. For example, when the third voltage supply signal SAN is enabled, the seventh transistor N5 may provide the second voltage supply line SB with the ground voltage VSS. The seventh transistor N5 may include a gate for receiving the third voltage supply signal SAN, a drain connected to the second voltage supply line SB, and a source for receiving the ground voltage VSS.

The third voltage supply circuit 230 may selectively provide the third voltage supply line SA_VBB with any one of the first negative voltage VBB1 and the second negative voltage VBB2 in response to the bias control signal B_ctrl. For example, when the bias control signal B_ctrl is disabled, the third voltage supply circuit 230 may provide the third voltage supply line SA_VBB with the first negative voltage VBB1. When the bias control signal B_ctrl is enabled, the third voltage supply circuit 230 may provide the third voltage supply line SA_VBB with the second negative voltage VBB2. The second negative voltage VBB2 may have a level higher than that of the first negative voltage VBB1.

The third voltage supply circuit 230 may include a first negative voltage generation circuit 231, a second negative voltage generation circuit 232 and a switching circuit 233.

The first negative voltage generation circuit 231 may generate the first negative voltage VBB1.

The second negative voltage generation circuit 232 may generate the second negative voltage VBB2.

The switching circuit 233 may provide the third voltage supply line SA_VBB with any one of the first and second negative voltages VBB1 and VBB2 in response to the bias control signal B_ctrl. For example, when the bias control signal B_ctrl is enabled, the switching circuit 233 may provide the third voltage supply line SA_VBB with the second negative voltage VBB2. In contrast, when the bias control signal B_ctrl is disabled, the switching circuit 233 may provide the third voltage supply line SA_VBB with the first negative voltage VBB1.

Figure 4:
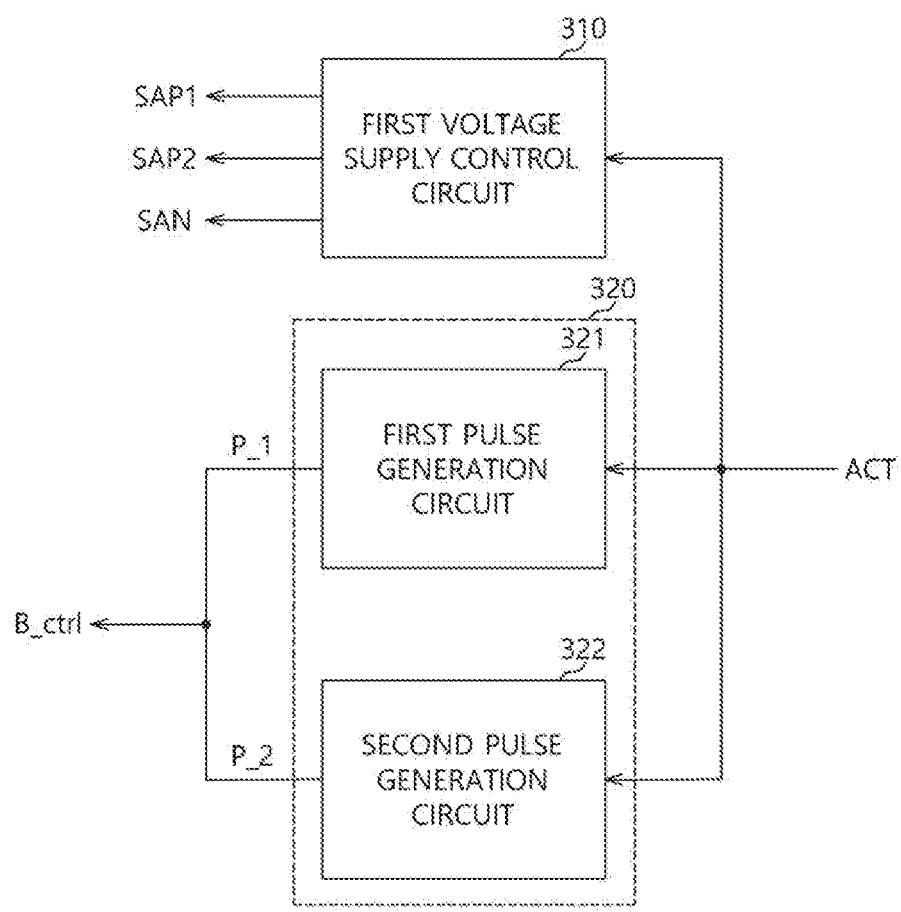
FIG. 4 is a view illustrating an example embodiment of a voltage supply control circuit employed in the semiconductor memory device shown in FIG. 1.

FIG. 4 is a view illustrating an exemplary voltage supply control circuit 300 of FIG. 1.

Referring to FIG. 4, the voltage supply control circuit 300 may include a first voltage supply control circuit 310 and a second voltage supply control circuit 320.

The first voltage supply control circuit 310 may generate the first to third voltage supply signals SAP1, SAP2 and SAN in response to the active signal ACT. For example, when the active signal ACT is enabled, the first voltage supply control circuit 310 may enable the first voltage supply signal SAP1 for a set time. When the first voltage supply signal SAP1 is disabled, the first voltage supply control circuit 310 may enable the second voltage supply signal SAP2 for a set time. The first voltage supply control circuit 310 may generate the third voltage supply signal SAN having an enable section substantially the same as those of the first and second voltage supply signals SAP1 and SAP2.

The second voltage supply control circuit 320 may generate the bias control signal B_ctrl enabled for a set time when the active signal ACT is enabled and disabled.

The second voltage supply control circuit 320 may include a first pulse generation circuit 321 and a second pulse generation circuit 322.

When the active signal ACT is enabled, the first pulse generation circuit 321 may generate a first pulse P_1. The first pulse generation circuit 321 may output the first pulse P_1 as the bias control signal B_ctrl. For example, when the active signal ACT is enabled to a low level, the first pulse generation circuit 321 may generate the first pulse P_1 in response to a falling edge of the active signal ACT. The first pulse generation circuit 321 may then output the first pulse P_1 as the bias control signal B_ctrl.

When the active signal ACT is disabled, the second pulse generation circuit 322 may generate a second pulse P_2. The second pulse generation circuit 322 may output the second pulse P_2 as the bias control signal B_ctrl. For example, when the active signal ACT is disabled to a high level, the second pulse generation circuit 322 may generate the second pulse P_2 in response to a rising edge of the active signal ACT. The second pulse generation circuit 322 may then output the second pulse P_2 as the bias control signal B_ctrl.

Hereinafter, operations of the semiconductor memory device in accordance with example embodiments may be illustrated with reference to FIG. 5.

Figure 5:
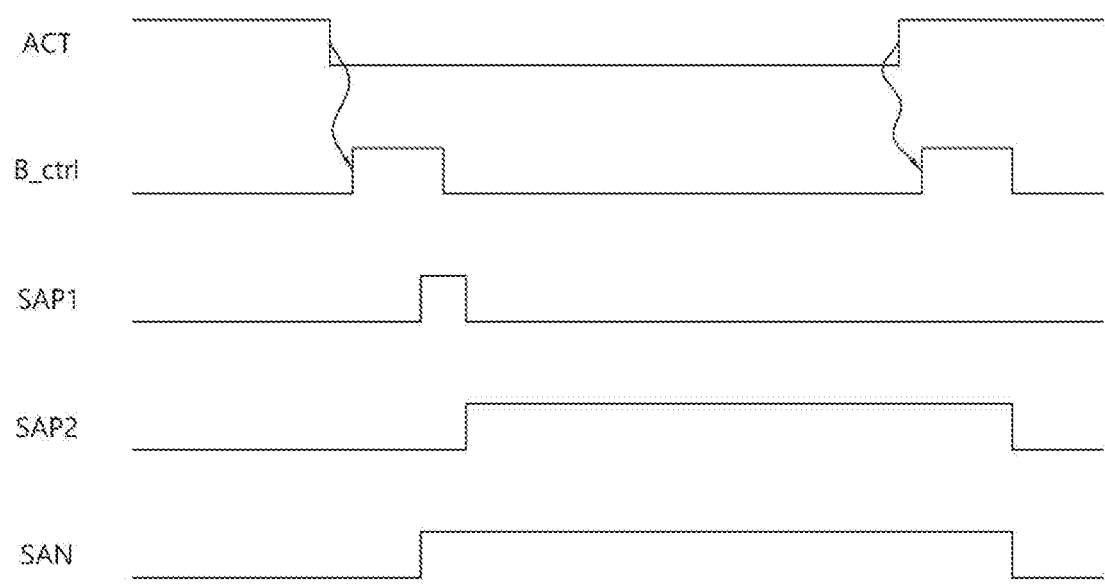
FIG. 5 is a timing chart illustrating an operation of the semiconductor memory device in accordance with example embodiments.

FIG. 5 is a timing chart illustrating operations of the semiconductor memory device in accordance with example embodiments.

The voltage supply control circuit 300 may generate the first to third voltage supply signals SAP1, SAP2 and SAN, and the bias control signal B_ctrl in response to the active signal ACT. When the active signal ACT is enabled to a low level, the voltage supply control circuit 300 may enable the bias control signal B_ctrl for a set time. When the active signal ACT is enabled to a low level, the voltage supply control circuit 300 may generate the first voltage supply signal SAP1 enabled for a set time. An enabled section of the bias control signal B_ctrl may be wholly or partially overlapped with an enabled section of the first voltage supply signal SAP1. When the first voltage supply signal SAP1 is disabled, the voltage supply control circuit 300 may enable the second voltage supply signal SAP2. When the first voltage supply signal SAP1 is enabled, the voltage supply control circuit 300 may enable the third voltage supply signal SAN. When the active signal ACT is disabled to a high level, the voltage supply control circuit 300 may disable the bias control signal B_ctrl for a set time. When the active signal ACT is disabled to a high level, the voltage supply control circuit 300 may disable the second and third voltage supply signals SAP2 and SAN. Thus, a sum of the enabled sections of the first and second voltage supply signals SAP1 and SAP2 may be substantially the same as an enabled section of the third voltage supply signal SAN.

The first to third voltage supply signals SAP1, SAP2 and SAN and the bias control signal B_ctrl generated in response to the active signal ACT may be inputted into the first to third voltage supply circuits 210, 220 and 230.

The first voltage supply circuit 210 may selectively provide the first voltage supply line RTO with the high voltage VPP and the external voltage VDD in response to the first and second voltage supply signals SAP1 and SAP2. The first voltage supply circuit 210 may provide the first voltage supply line RTO with the high voltage VPP in the enabled section of the first voltage supply signal SAP1. The first voltage supply circuit 210 may provide the first voltage supply line RTO with the external voltage VDD in the enabled section of the second voltage supply signal SAP2.

The second voltage supply circuit 220 may provide the second voltage supply line SB with the ground voltage VSS in response to the third voltage supply signal SAN. The second voltage supply circuit 220 may provide the second voltage supply line SB with the ground voltage VSS in the enabled section of the third voltage supply signal SAN.

The third voltage supply circuit 230 may selectively provide the third voltage supply line SA_VBB with any one of the first negative voltage VBB1 and the second negative voltage VBB2 in response to the bias control signal B_ctrl. When the bias control signal B_ctrl is enabled, the third voltage supply circuit 230 may provide the third voltage supply line SA_VBB with the second negative voltage VBB2. In contrast, when the bias control signal B_ctrl is disabled, the third voltage supply circuit 230 may provide the third voltage supply line SA_VBB with the first negative voltage VBB1.

The sense amplifier 100 may be activated during the driving voltages VPP, VDD and VSS may be applied to the sense amplifier 100 through the first to third voltage supply lines RTO, SB and SA_VBB. The activated sense amplifier 100 may detect and amplify the voltage levels of the data line Data_L and the data-bar line Datab_L.

Hereinafter, detecting and amplifying the voltage levels of the data line Data_L and the data-bar line Datab_L by the sense amplifier 100 may be illustrated in detail with reference to FIG. 5.

When the active signal ACT is enabled to a low level, the bias control signal B_ctrl, the first voltage supply signal SAP1 and the third voltage supply signal SAN may be enabled.

The second negative voltage VBB2 may be supplied to the sense amplifier 100 through the third voltage supply line SA_VBB in the enabled section of the bias control signal B_ctrl.

The high voltage VPP may be supplied to the sense amplifier 100 through the first voltage supply line RTO in the enabled section of the first voltage supply signal SAP1.

After the first voltage supply signal SAP1 may be disabled, the external voltage VDD may be supplied to the sense amplifier 100 through the first voltage supply line RTO in the enabled section of the second voltage supply signal SAP2.

The ground voltage VSS may be supplied to the sense amplifier 100 through the second voltage supply line SB in the enabled section of the third voltage supply signal SAN.

The voltages VPP, VDD and VSS supplied through the first and second voltage supply lines RTO and SB may activate the sense amplifier 100. The activated sense amplifier 100 may detect and amplify the voltage difference between the data line Data_L and the data-bar line Datab_L.

Hereinafter, detecting and amplifying the voltage difference between the data line Data_L and the data-bar line Datab_L by the activated sense amplifier 100 may be illustrated with reference to FIG. 2.

When the voltage difference between the gate and the source in each of the transistors P1, P2, N1 and N2, which is generated by the voltage difference between the data line Data_L and the data-bar line Datab_L, is higher than the threshold voltage of each of the transistors P1, P2, N1 and N2, the transistors P1, P2, N1 and N2 in the sense amplifier 100 may be selectively turned-on. Thus, the sense amplifier 100 may amplify the voltage levels of the data line Data_L and the data-bar line Datab_L to the voltage levels of the first and second voltage supply lines RTO and SB.

When the sense amplifier 100 detects the voltage difference between the data line Data_L and the data-bar line Datab_L i.e., when the transistors are turned on due to the voltage difference between the gate and the source in each of the transistors P1, P2, N1 and N2 higher than the threshold voltage of each of the transistors P1, P2, N1 and N2, the third and fourth transistors N1 and N2 may receive the second negative voltage VBB2 having the level higher than that of the first negative voltage VBB1 as the back bias voltage so that the threshold voltages of the third and fourth transistors N1 and N2 may be decreased.

When the threshold voltages of the third and fourth transistors N1 and N2 are decreased, the level difference between the threshold voltages of the third and fourth transistors N1 and N2 generated in a process may also be decreased by the decreased threshold voltage.

Additionally, when the threshold voltages of the third and fourth transistors N1 and N2 are decreased, although the voltage difference between the data line Data_L and the data-bar line Datab_L is higher than the decreased threshold voltage, the sense amplifier 100 may detect the voltage difference between the data line Data_L and the data-bar line Datab_L so that the sense amplifier 100 may be rapidly operated to detect the voltage difference between the data lines.

When the bias control signal B_ctrl is disabled after detecting the voltage difference between the data line Data_L and the data-bar line Datab_L by the sense amplifier 100, the first negative voltage VBB1 having the level lower than that of the second negative voltage VBB2 may be supplied to the sense amplifier 100 through the third voltage supply line SA_VBB. The third and fourth transistors N1 and N2 of the sense amplifier 100 may receive the first negative voltage VBB1 as the back bias voltage to increase the threshold voltages of the third and fourth transistors N1 and N2, thereby reducing a leakage current.

When the active signal ACT is disabled, the sense amplifier 100 may pre-charge the voltage levels of the data line Data_L and the data-bar line Data_L to provide the data line Data_L and the data-bar line Datab_L with a pre-charge voltage. When the sense amplifier 100 performs the pre-charge operation in response to the disabled active signal ACT, the sense amplifier 100 may receive the second negative voltage VBB2 having the level higher than that of the first negative voltage VBB1 through the third voltage supply line SA_VBB. When the threshold voltages of the third and fourth transistors N1 and N2 in the sense amplifier 100 are decreased, the level difference between the threshold voltages of the third and fourth transistors N1 and N2 may also be decreased by the decreased threshold voltage. Further, when the threshold voltages of the third and fourth transistors N1 and N2 are decreased, the sense amplifier 100 may more sensitively react to the voltage difference between the data line Data_L and the data-bar line Datab_L so that the data line Data_L and the data-bar line Datab_L may rapidly react to the pre-charge voltage level.

According to example embodiments, when the sense amplifier detects and amplify the voltage difference between the data line and the data-bar line or the voltage levels of the data line and the data-bar line reach to the pre-charge voltage level, i.e., when the voltage levels of the data line and the data-bar line connected with the sense amplifier are changed, the levels of the back bias voltages of the transistors in the sense amplifier may be increased to reduce the difference between the threshold voltages of the transistors.

For example, when designed threshold voltages of each of the transistors in the sense amplifier are 5 units, the threshold voltages may be changed to 4 and 6 units due to the process, the voltage and/or the temperature variation. In order to compensate this mismatch, the level of the back bias voltage may be increased to reduce the threshold voltages by about 20%. Thus, the threshold voltages may be changed from 4 to 3.2 units and from 6 to 4.8 units. Before increasing the threshold voltages, the difference between 4 and 6 units of the threshold voltages may be 2 units. However, after increasing the threshold voltages, the difference between 3.2 and 4.8 units of the threshold voltages may be 1.6 units. Therefore, when the voltage levels of the data lines connected to the sense amplifier are changed, the back bias voltage level may be increased to compensate the mismatch between the transistors. Further, when the voltage levels of the data lines connected to the sense amplifier are changed, the back bias voltage level may be increased to reduce the threshold voltages of the transistors so that the transistor may be rapidly turned-on. As a result, the sense amplifier may have improved data response speed.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications which are obvious in view of the present disclosure are intended to fall within the scope of the present invention as defined by the appended claims.

What is claimed is:

1. A semiconductor memory device comprising:
   a sense amplifier suitable for detecting and amplifying a voltage level difference between a data line and a data-bar line;
   a voltage supply circuit suitable for applying driving voltages to the sense amplifier via first to third voltage supply lines in response to first to third voltage supply signals and a bias control signal; and
   a voltage supply control circuit suitable for generating the first to third voltage supply signals and the bias control signal in response to an active signal,
   wherein the sense amplifier is activated by receiving the driving voltages, and
   wherein the voltage supply circuit selectively applies any one of a high voltage and an external voltage to the first voltage supply line in response to the first and second voltage supply signals, the voltage supply circuit applies a ground voltage to the second voltage supply line in response to the third voltage supply signal, and the voltage supply circuit applies any one of a first negative voltage and a second negative voltage to the third voltage supply line in response to the bias control signal.

2. The semiconductor memory device of claim 1, wherein the sense amplifier comprises a plurality of transistors having N channel transistors and P channel transistors and, the first and second voltage supply lines are connected to a drain or a source of each of the transistors, and the third voltage supply line is connected to a back bias voltage terminal of the N channel transistors.

3. The semiconductor memory device of claim 1, wherein the second negative voltage has a level higher than that of the first negative voltage.

4. The semiconductor memory device of claim 3, wherein the voltage supply circuit applies the second negative voltage to the third voltage supply line when the bias control signal is enabled, and the voltage supply circuit applies the first negative voltage to the third voltage supply line when the bias control signal is disabled.

5. The semiconductor memory device of claim 1, wherein the voltage supply control circuit enables the third voltage supply signal when the active signal is enabled, the voltage supply control circuit enables the bias control signal and the first voltage supply signal for a set time, and the voltage supply control circuit enables the second voltage supply signals when the first voltage supply signal is disabled.

6. The semiconductor memory device of claim 5, wherein the voltage supply control circuit enables the bias control signal for a set time and disables the second and third voltage supply signals when the active signal is disabled.

7. The semiconductor memory device of claim 6, wherein the voltage supply control circuit comprises:
   a first pulse generation circuit for generating a first pulse when the active signal is enabled; and
   a second pulse generation circuit for generating a second pulse when the active signal is disabled,
   wherein the first and second pulses are outputted as the bias control signal.

8. A semiconductor memory device comprising:
   a sense amplifier including a plurality of transistors, the transistors including N channel transistors and P channel transistors;
   a voltage supply control circuit for generating a bias control signal in response to an active signal; and
   a voltage supply circuit for providing the N channel transistors with any one of a first negative voltage and a second negative voltage as a back bias voltage in response to the bias control signal.

9. The semiconductor memory device of claim 8, wherein the second negative voltage has a level higher than that of the first negative voltage.

10. The semiconductor memory device of claim 9, wherein the voltage supply control circuit generates the bias control signal enabled for a set time when the active signal is enabled and disabled.

11. The semiconductor memory device of claim 10, wherein the voltage supply control circuit comprises:
   a first pulse generation circuit for generating a first pulse when the active signal is enabled; and
   a second pulse generation circuit for generating a second pulse when the active signal is disabled,
   wherein the first and second pulses are outputted as the bias control signal.

12. The semiconductor memory device of claim 11, wherein the voltage supply control circuit provides the second negative voltage as the back bias voltage when the bias control signal is enabled, and the voltage supply control circuit provides the first negative voltage as the back bias voltage when the bias control signal is disabled.

13. A semiconductor memory device comprising:
   a sense amplifier including a plurality of transistors including at least one N channel transistor and at least one P channel transistor,
   wherein a back bias voltage of the at least one N channel transistor is changed from a first negative voltage to a second negative voltage when voltage levels of a data line and a data-bar line are changed.

14. The semiconductor memory device of claim 13, wherein a level of the back bias voltage is increased for a set time when the voltage levels of the data line and the data-bar line are changed from a same level to different levels, and the level of the back bias voltage is increased for a set time when the voltage levels of the data line and the data-bar line are changed from the different levels to the same level.

15. The semiconductor memory device of claim 14, further comprising:
   a voltage supply control circuit for enabling the bias control signal for a set time when an active signal is enabled or disabled; and
   a voltage supply circuit for providing any one of the first negative voltage and the second negative voltage as the back bias voltage in response to the bias control signal.

16. The semiconductor memory device of claim 15, wherein the second negative voltage has a level higher than that of the first negative voltage.

17. A semiconductor memory device comprising:
   a sense amplifier suitable for amplifying a voltage difference between a data line and a data-bar line; and
   a voltage supply unit suitable for increasing a back bias voltage of at least one N channel transistor constituting the sense amplifier when the voltage difference changes.

* * * * *